(12) United States Patent
Camerlenghi

(10) Patent No.: US 6,420,223 B2
(45) Date of Patent: Jul. 16, 2002

(54) MANUFACTURING PROCESS FOR NON-VOLATILE FLOATING GATE MEMORY CELLS INTEGRATED ON A SEMICONDUCTOR SUBSTRATE AND COMPRISED IN A CELL MATRIX WITH AN ASSOCIATED CONTROL CIRCUITRY

(75) Inventor: Emilio Camerlenghi, Bergamo (IT)

(73) Assignee: STMicroelectronics S.R.L., Agrate Brianza (IT)

(*) Notice: Subject to any disclaimer, the term of this patent is extended or adjusted under 35 U.S.C. 154(b) by 34 days.

(21) Appl. No.: 09/730,518

(22) Filed: Dec. 5, 2000

(30) Foreign Application Priority Data

Dec. 6, 1999 (EP) ............................................. 99830755

(51) Int. Cl.[7] ......................................... H01L 21/8238
(52) U.S. Cl. ........................ 438/211; 438/241; 438/257
(58) Field of Search ................................ 438/211, 241, 438/257, 258; 257/315, 316, 500

(56) References Cited

U.S. PATENT DOCUMENTS

| | | | | |
|---|---|---|---|---|
| 4,672,409 A | | 6/1987 | Takei et al. ................. | 357/33.5 |
| 5,036,018 A | * | 7/1991 | Mazzali ....................... | 438/201 |
| 5,223,451 A | * | 6/1993 | Uemura et al. .............. | 257/314 |
| 5,340,764 A | * | 8/1994 | Larsen et al. ................ | 257/314 |
| 5,863,820 A | | 1/1999 | Huang ......................... | 438/241 |
| 5,991,204 A | | 11/1999 | Chang .................... | 365/185.29 |
| 6,037,625 A | * | 3/2000 | Matsubara et al. ......... | 257/315 |
| 6,159,799 A | * | 12/2000 | Yu .............................. | 438/211 |
| 6,228,714 B1 | * | 5/2001 | Choi ........................... | 438/258 |
| 6,255,690 B1 | * | 7/2001 | Komori et al. ............. | 257/315 |

FOREIGN PATENT DOCUMENTS

| | | | | |
|---|---|---|---|---|
| EP | 0656663 | 6/1995 | ......... | H01L/29/788 |

OTHER PUBLICATIONS

Patent Abstracts of Japan, vol. 1998, No. 08, (Jun. 30, 1998) & JP 10 074914 A (Nec Corp), (Mar. 17, 1998).

* cited by examiner

*Primary Examiner*—Olik Chaudhuri
*Assistant Examiner*—Hoai Pham
(74) *Attorney, Agent, or Firm*—Lisa K. Jorgenson; Allen, Dyer, Doppelt, Milbrath & Gilchrist, P.A.

(57) ABSTRACT

A process for forming floating gate non-volatile memory cells in a cell matrix with associated control circuitry comprising both N-channel and P-channel MOS transistors is provided. The process includes forming active areas in a substrate for the cell matrix and the associated control circuitry. A first thin oxide layer and a first polysilicon layer are deposited on the active areas to produce floating gate regions of the memory cells, and a second dielectric layer is deposited on the active areas. A second polysilicon layer is then deposited on the active areas. A masking and etching step is performed for exposing the substrate for the associated control circuitry followed by the deposition of a third polysilicon layer. The third polysilicon layer is defined to produce the gate regions of the transistors for the associated control circuitry while the third polysilicon layer is removed from the cell matrix. A self-aligned etching step is performed to define the gate regions of the memory cells, and dopants are implanted in the junction areas to produce the source/drain regions of the memory cells.

33 Claims, 3 Drawing Sheets

 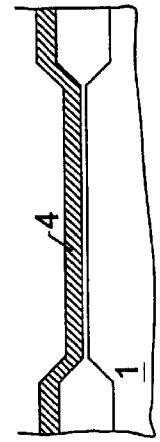 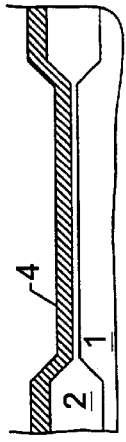 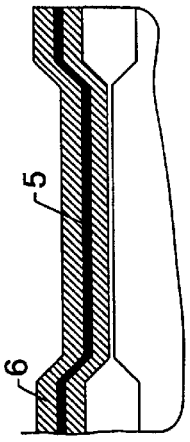
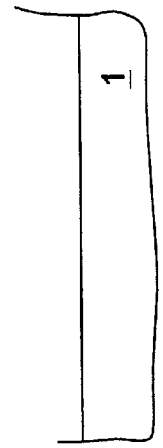 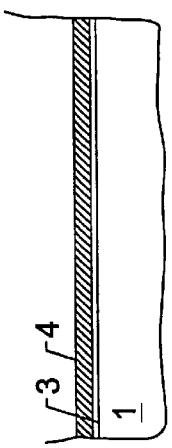 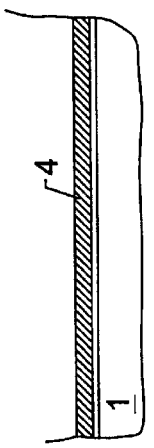 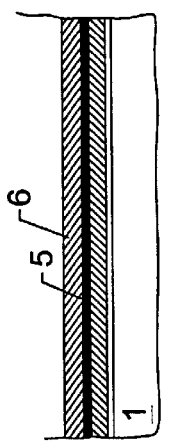
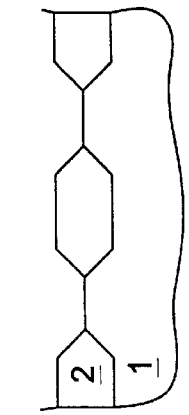 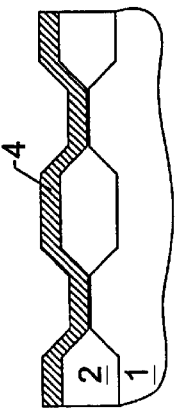 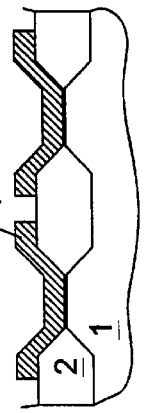 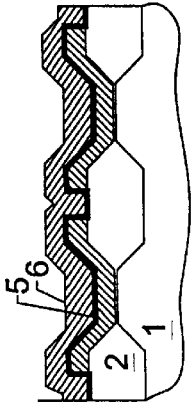

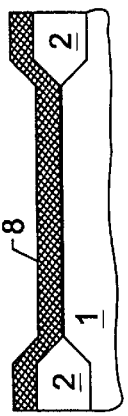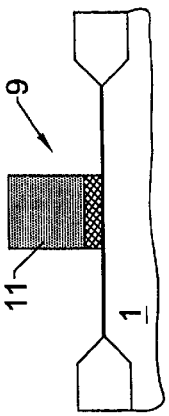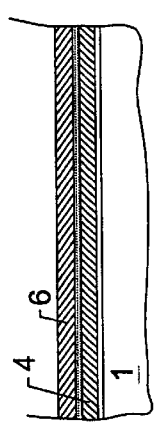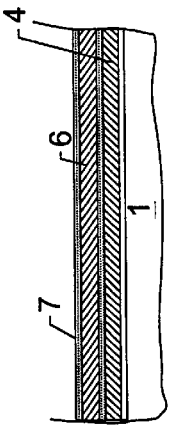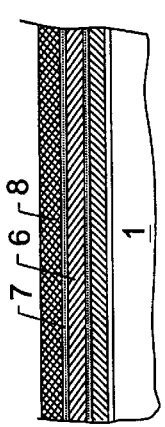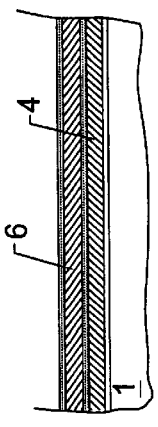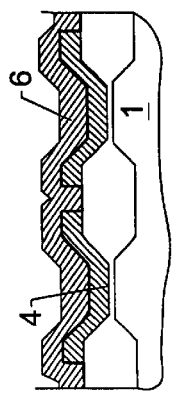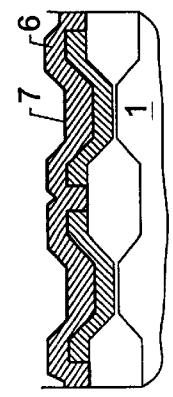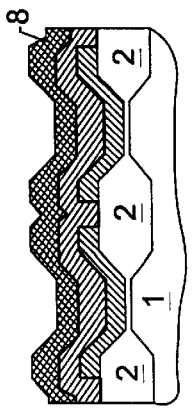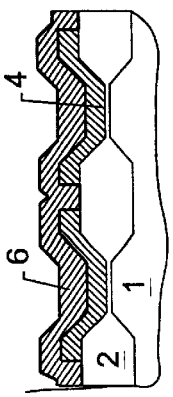

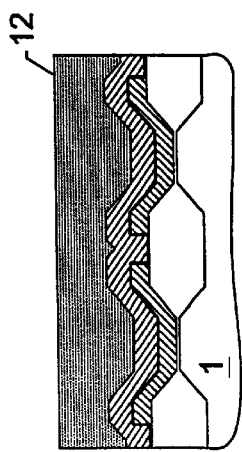
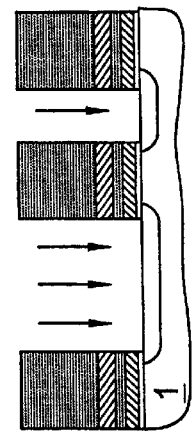
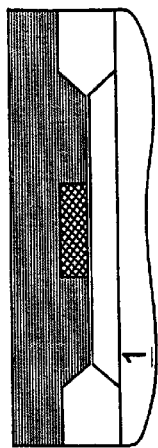
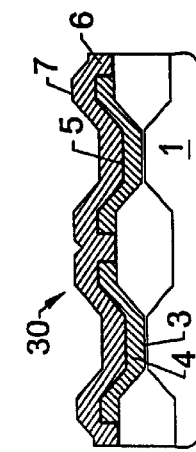
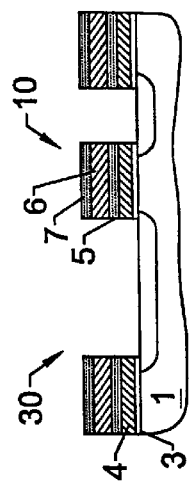
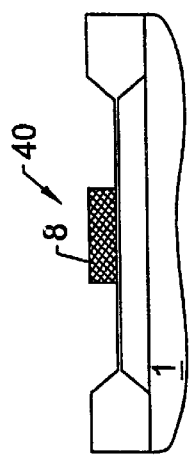
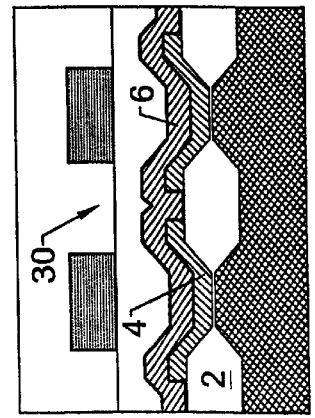
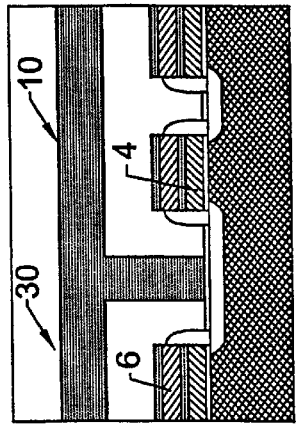
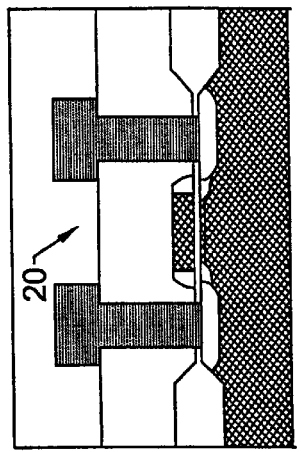

MANUFACTURING PROCESS FOR NON-VOLATILE FLOATING GATE MEMORY CELLS INTEGRATED ON A SEMICONDUCTOR SUBSTRATE AND COMPRISED IN A CELL MATRIX WITH AN ASSOCIATED CONTROL CIRCUITRY

FIELD OF THE INVENTION

The present invention relates to a process for manufacturing floating gate non-volatile memory cells integrated on a semiconductor substrate which are incorporated in a cell matrix with an associated control circuitry. The process is compatible with salicide processes, and relates particularly, but not exclusively, to a process flow for manufacturing non-volatile memories, typically of the EPROM or Flash type, and electronic devices using salicide layers.

BACKGROUND OF THE INVENTION

Reducing the size of elementary electronic devices (transistors, memory cells, etc.) involves lowering their supply voltage (Vdd). In turn, a lower supply voltage reflects a need to lower by an equal amount the threshold voltage (Vth) of the transistors so that a sufficient overdrive voltage can be provided.

The technological generations upwards of 0.35 mm featuring supply voltages below 3V require threshold values equal to or lower than 0.6V. Attaining these objectives is especially difficult where traditional CMOS processes are used in which the transistor gate regions are formed from N+ doped polysilicon overlaid with a layer which may comprise a metal layer, such as a salicide layer. This process involves forming buried channel transistors which features an inherent weakness with respect to leakage currents. For example, a buried channel P-channel transistor would have an N+ gate in an opposite implanted substrate.

In general, for technological generations of 0.35 mm and up, a salicide process (self-aligned silicide) is used. This process provides dual gate transistors, i.e., N-channel transistors with an N+ gate region and P-channel transistors with a P+ gate region. In this way, the P-channel transistors can be formed as mirror images of the N-channel transistors, again with no opposite-implantations. Thus, the advantage of low threshold values can be secured at the same time as the leakage and punch-through problems are minimized.

Briefly, the process of manufacturing dual gate transistors using salicide layers comprises forming initially an undoped polysilicon layer isolated from a semiconductor substrate by an oxide layer to produce the gate regions. After a patterning of the polysilicon gate regions by a photolithographic technique, two appropriate masks are used to carry out the LDD implantations (N− and P−) for N-channel and P-channel transistors to form first lightly doped portions of the junction areas (source/drain regions) of the transistors.

Spacers are then formed on the side walls of each transistor gate region. At this step, the heavy implantations (N+ and P+) for the junction areas are carried out, again using two masks. These implants form second heavily doped portions of the source/drain regions while simultaneously doping the gate polysilicon which will be N+ for the N-channel transistors and P+ for the P-channel transistors.

The process further comprises activating the implanted dopant species by an appropriate thermal treatment, and depositing a thin metal layer (e.g., Ti/TiN). The last-mentioned layer is then reacted with the silicon of the junction and gate areas by a suitable thermal treatment to produce so-called salicide layers (e.g., $TiSi_2$). The unreacted metal still present in the oxide zones at the spacers or on field oxide, for example, is subsequently selectively removed using an appropriate chemical solution.

In the salicide process, the metal layers are self-aligned to the junction areas and the gate regions. Consequently, compared to a conventional process, the salicide process also allows the series resistances of the junction areas to be reduced, thereby achieving faster performance. At the same time, by having the N+ and P+ implantations carried out before the metal layer is formed over the gate region, the salicide process can be best integrated to the process of forming dual gate regions.

To complete the description of a typical salicide layer forming process, it remains to be said that it is nearly always necessary to prevent the formation inside a device of salicide over certain structures, such as ESD protection structures, for example. Just prior to depositing the metal layer to be reacted with the silicon (e.g., titanium or titanium nitride Ti/TiN), a thin material layer is usually deposited to prevent the salicide phase from forming. The thin material layer may be a layer of oxide or nitride. This layer is then removed selectively by masking (Siprot mask) all those regions where the formation of the salicide layer is required. These regions protect the zones where the metal/silicon reaction should not be prevented.

As said above, the salicide process is widely used for producing advanced CMOS logic processes for the manufacture of microprocessors and microcontrollers and which require, component-wise, that only N-channel and P-channel transistors be provided. Integrating additional components, such as DRAM cells or non-volatile EPROM or Flash-EPROM cells, in such processes is instead a more innovative field.

Semiconductor integrated electronic memory devices of the EPROM or Flash-EPROM type comprise a plurality of non-volatile memory cells organized in matrix form, i.e. into rows or word lines and columns or bit lines. Each non-volatile memory cell comprises a MOS transistor having a floating gate electrode above the channel region. That is, a gate electrode showing a high impedance to all the other terminals of the cell itself and of the circuit in which it is connected. The cell also has a second electrode called the control gate which is coupled to the floating gate electrode, and is driven by appropriate control voltages. The other transistor electrodes are the customary drain and source junction terminals.

Integrating such memory cells to a salicide process has some disadvantages, including those listed below. The presence of salicide over the cell junctions can result in increased junction leakage current. Forming salicide in the memory cell may prove difficult and, therefore, hardly reproducible due to the small dimensions of the geometries. This is especially so at the gate (word line).

In the memory cells, both before the deposition of a first metal layer and after the reaction with the silicon that forms the salicide layer, the thick oxide layer which has been grown thereover during the oxidation step must be removed. The thick oxide layer seals the cell. This removal, when performed in a blanketing manner (i.e., everywhere), may degrade the characteristics of the transistor junctions from which such a deep removal would be unnecessary. Alternatively, an additional masking step would have to be carried out to remove the oxide layer from the cell region only.

A first technical approach to these problems provides a process flow whereby the salicide can only be formed in the peripheral zones of a memory device (transistors, resistors, etc.) and not in the memory cell matrix zone. Using the Siprot mask, the physical removal of salicide from the matrix zone can be easily achieved by protecting the matrix with the mask.

While being in many ways advantageous, this first approach has some drawbacks. In fact, without the salicide layer in the memory matrix, a way must be found of ensuring a minimum level of resistivity for the layer which comprises the word lines, i.e., the long strips to which the gates of the cells situated in a given matrix row belong. By providing a metal level useful to produce periodical contacting of the word lines, the so-called wordline strapping or shunting resistances in the range of 100 ohms become compatible with a contact of the metal layer to the word line every 256 cells. These resistances can be obtained by heavily doping the polysilicon layer that comprises the word line using concentrations in excess of 1E20 atoms/cm$^3$, for example.

Since blanket doping of the polysilicon is not feasible, this heavy doping in the matrix zone alone can be obtained by using an additional mask and a heavy ion implantation step, e.g., a P dosage of about 1E16 atoms/cm$^3$. The polysilicon should be suitably doped N+ or P+ according to the zones. However, this a very expensive approach.

A second approach comprises re-implanting the matrix zone during the implantation of the N+ junctions of the transistors. This approach has an advantage in that it introduces no additional steps, but also has an obvious disadvantage. The transistor N+ implantations usually are not optimized both in dosage and energy values for their introduction to the matrix. Thus, a fraction of the implanted dosage might pass through the thin residual insulation oxide layer which separates the drain regions of the various cells, and short-circuit adjacent columns (bit lines).

SUMMARY OF THE INVENTION

An object of the present invention is to provide a process for manufacturing non-volatile memory cells incorporated in matrices with associated circuitry using salicide technology to minimize the process steps and overcome the limitations and drawbacks of conventional processes.

The concept behind this invention is one of having the cell gate regions, and hence the word lines of the memory cell matrix, doped by a heavily doped polysilicon layer which is deposited after the interpoly layer of the matrix. This layer is then removed from the circuitry associated with the matrix without involving any additional process steps.

More particularly, the process includes forming a plurality of active areas in the semiconductor substrate for the cell matrix and the control circuitry, forming a first dielectric layer and a first polysilicon layer on the active areas to produce floating gate regions for the memory cells, forming a second dielectric layer on the first polysilicon layer, and forming a second polysilicon layer on the first polysilicon layer.

The process preferably further includes doping the second polysilicon layer to reduce a resistance thereof, and removing the second polysilicon layer, the second dielectric layer, the first polysilicon layer, and the first oxide layer from the active areas for the control circuitry using a first mask. At least one additional oxide layer and a third undoped polysilicon layer is preferably formed on the active areas for the control circuitry and on the second polysilicon layer.

The third polysilicon layer is preferably defined to produce gate regions for the MOS transistors of the control circuitry using a second mask while removing the third polysilicon layer from the active areas for the cell matrix. A self-aligned etching step is preferably performed above the active areas for the cell matrix to define gates for the memory cells using a third mask protecting the active areas for the control circuitry. Dopants may be implanted in junction areas to produce source/drain regions for the memory cells.

BRIEF DESCRIPTION OF THE DRAWINGS

The features and advantages of the device according to the present invention will be apparent from the following description of an embodiment thereof, given by way of examples which are not of limitation with reference to the accompanying drawings.

FIGS. 1 to 11 are cross-sectional views showing different portions of a semiconductor substrate based upon a fabrication process according to the present invention.

DETAILED DESCRIPTION OF THE PREFERRED EMBODIMENTS

A process for manufacturing floating gate non-volatile memory cells 10 integrated in a semiconductor substrate 1 and incorporated with a cell matrix 30 having control circuitry 40 associated therewith will be described with reference to the drawing figures. The control circuitry comprises P-channel and N-channel MOS transistors 20. This process description is based on FIGS. 1 to 11, which show to an enlarged scale respective vertical cross-sections through portions, not necessarily in adjacent directions, of a semiconductor substrate 1 being applied the process steps of this invention.

More particularly, a first portion designated A represents a cross-section, taken along a first direction X, through semiconductor zones where the memory cells are formed. A second portion designated B represents a cross-section, taken along a second direction Y, through semiconductor zones where the memory cells are formed. A third zone designated C represents a cross-section through semiconductor zones where the circuitry transistors are formed.

A process for manufacturing floating gate non-volatile memory cells in a NOR type of configuration comprises forming initially a thick oxide layer 2 over a semiconductor substrate 1 to define active areas of the memory cells and the circuitry transistors 20, as shown in FIG. 1. N wells and P wells are then formed to accommodate the P-channel and N-channel transistors 20.

All of the implanting operations for defining the threshold voltages of the different active devices to be formed by the fabrication process (N-channel and P-channel transistors, and memory cells) can be carried out during this step, if required. Thereafter, a thin gate oxide layer 3 for the memory cell is grown. This layer is also known as the tunnel oxide for Flash memories. This step is followed by depositing and doping (usually N+) a first polysilicon layer 4 called POLY 1 (FIG. 2).

The first polysilicon layer 4 is then patterned with parallel rows to define floating gate regions of the memory cells in a perpendicular direction to the active areas (FIG. 3). After defining the floating gates, an interpoly dielectric layer 5, typically comprising successive oxide/nitride/oxide layers known as ONO is grown.

At this step, the process of the invention comprises the following steps. Depositing a second polysilicon layer 6 called the "poly cap" for use in forming the gates of the memory cells called the word line (FIG. 4). This layer 6 is heavily doped (typically N+) using conventional techniques effective to depress its resistivity, such as by POCl3 or in situ during the deposition. Typical concentrations are in the range of 2-3E20 atoms/cm$^3$.

The stack comprising the poly cap 6, ONO 5, poly 4, and gate (or tunnel) oxide layer 3 is then removed from the circuitry regions. This selective removal is effected by a photolithographic technique using a mask called the matrix or protect-array mask. The substrate emerges from the operation in the same condition as before the gate oxidation. The substrate includes the silicon exposed in the active area zones where the circuitry transistors 20 will be formed, and with the field oxide layer in the complementary isolation regions.

At least one gate oxide layer 7 (FIG. 6) is then grown. It would be possible to grow more than one gate oxide layer. In fact, if the process comprises forming low-voltage (LV) transistors simultaneously with high-voltage (HV) transistors, they are formed with gate oxide layers of differential thickness.

In this case, two gate oxide layers may be formed using conventional techniques. A first oxidation is performed followed by removal of this grown oxide layer from the LV zones by a photolithographic technique based on the use of a so-called "differential oxide" mask, and subsequent growing of this second LV oxide layer. It is important to observe that during these operations the oxide layer will be grown, not only over the active area zones, but also over the top of the poly cap layer 6. This forms a further oxide layer known as the top oxide.

A third polysilicon layer 8, called Poly 2, is deposited which will comprise the gate regions of the circuitry transistors (FIG. 7). Advantageously, this third layer is deposited undoped or only lightly doped. At this step, the gate regions 9 of the circuitry transistors are defined by a conventional photolithographic technique using a mask 11 called the "transistor gate" mask, followed by etching through the third polysilicon layer 8 and optionally the gate oxide layer 7 beneath (FIG. 8).

According to the invention, the transistor gate mask 11 is formed such that the matrix region is left unprotected by the mask. Accordingly, the transistor gate etching step will also remove the Poly 2 layer 8 from the zones where the cells are to be formed. Alternatively, where the etching removes the gate oxide layer as well, the top oxide layer 7 could also be fully or partly removed from the matrix.

The gate regions of the memory cells are then defined. By a photolithographic technique using a mask 12 called the "cell gate" or "self-aligned" mask, all the stack present in the matrix region is etched away. That is, the top oxide 7 if still there after the "transistor gate" etching, the poly cap 6 and the ONO 5, the layer 4 of Poly 1, and tunnel oxide (optionally) to define the gate regions of the memory cells. On completion of the self-aligned etching step and before removing the resist, the N+ implantation of the cell's source and drain junctions (FIG. 9) is carried out.

The cell gate mask obviously should be arranged to protect the previously defined circuitry zones where the second polysilicon layer 8 is to be left undoped from the etch and implantation. These process steps result in the gate regions being defined for both the transistors and the cells, with the latter being doped N+ with no additional process steps.

This process flow concurrently provides protection in the form of the poly cap layer 6 to the thin ONO stack layer 5 against resist removal of the matrix mask and differential gate mask if any (FIG. 5). From this point on, the process flows conventionally through a selective implantation of the cell source regions (necessary with Flash memories), re-oxidation of the cell, provision of the N– and P– implants intended for forming the transistor LDDs, provision of the spacers, and successive provision of the N+ and P+ implants to be used for implanting gate regions and junctions of the N-channel and P-channel transistors.

Further to a thermal treatment for activating these implants, a layer (typically of oxide or oxide/nitride) is deposited which, where not removed by a "silicide protect" mask, will hinder the silicon/metal reaction and, consequently, the formation of a salicide layer. Advantageously in the process of this invention, the matrix of memory cells is protected by this mask such that an undesired salicide layer can be prevented from forming over the matrix.

Other zones that can be protected against the formation of salicide comprise, for example, include the input/output zones and, more generally, the zones intended to accommodate ESD protection structures. The process flow then continues through the steps of forming the salicide layers, depositing a pre-metal dielectric, exposing contacts, metallizing and finally passivating, all in accordance with conventional techniques (FIG. 11). In summary, the process of this invention allows the polysilicon layers of the gate regions of the matrix and the circuitry to be differentiated without adding dedicated masking steps.

That which is claimed is:

1. A process for manufacturing floating gate memory cells in a semiconductor substrate for a cell matrix having associated therewith control circuitry comprising both N-channel and P-channel MOS transistors, the process comprising:

forming a plurality of active areas in the semiconductor substrate for the cell matrix and the control circuitry;

forming a first dielectric layer and a first conducting layer on the active areas to produce floating gate regions for the memory cells;

forming a second dielectric layer on the first conducting layer;

forming a second conducting layer on the first conducting layer;

removing a stack structure defined by the second conducting layer, the second dielectric layer, the first conducting layer, and the first dielectric layer on the active areas for the control circuitry using a first mask;

forming at least one additional dielectric layer and a third conducting layer on the active areas for the control circuitry and on the second conducting layer;

defining the third conducting layer to produce gate regions for the MOS transistors of the control circuitry using a second mask while removing the third conducting layer from the active areas for the cell matrix; and performing a self-aligned etching step above the active areas for the cell matrix to define gates for the memory cells using a third mask protecting the active areas for the control circuitry.

2. A process according to claim 1, further comprising implanting dopants in junction areas to produce source/drain regions for the memory cells.

3. A process according to claim 1, wherein each of the first, second and third conducting layers comprises polysysilicon.

4. A process according to claim 1, further comprising doping the first conducting layer.

5. A process according to claim 1, further comprising doping the second conducting layer to reduce a resistance thereof.

6. A process according to claim 1, wherein forming the plurality of active areas comprises forming N wells and P wells.

7. A process according to claim 1, wherein the second conducting layer is heavily doped.

8. A process according to claim 1, wherein the third conducting layer is not doped.

9. A process according to claim 1, further comprising removing the at least one additional dielectric layer from the cell matrix, using the second mask after removing the third conducting layer.

10. A process according to claim 1, further comprising:
performing a first implantation in junction areas to produce source/drain regions for the MOS transistors in the control circuitry;
forming spacers on the gate regions for the MOS transistors in the control circuitry; and
performing a second implantation in the source/drain regions and in the gate regions to produce gates for the MOS transistors in the control circuitry.

11. A process according to claim 1, further comprising forming a salicide layer on the semiconductor substrate external the cell matrix.

12. A process according to claim 1, further comprising:
forming at least one pre-metal dielectric layer on the active areas for the cell matrix and the control circuitry;
forming contact openings through the at least one pre-metal dielectric layer and corresponding underlying layers associated therewith; and
forming metallization and final passivation layers.

13. A process according to claim 1, wherein the cell matrix is formed so that the memory device is at least one of an EPROM device and a flash EPROM device.

14. A process for manufacturing floating gate non-volatile memory cells in a semiconductor substrate for a cell matrix having associated therewith control circuitry comprising both N-channel and P-channel MOS transistors, the process comprising:
forming a plurality of active areas in the semiconductor substrate for the cell matrix and the control circuitry;
forming a first dielectric layer and a first polysilicon layer on the active areas to produce floating gate regions for the memory cells;
forming a second dielectric layer on the first polysilicon layer;
forming a second polysilicon layer on the first polysilicon layer;
doping the second polysilicon layer to reduce a resistance thereof;
removing a stack structure defined by the second polysilicon layer, the second dielectric layer, the first polysilicon layer, and the first dielectric layer on the active areas for the control circuitry using a first mask;
forming at least one additional dielectric layer and a third undoped polysilicon layer on the active areas for the control circuitry and on the second polysilicon layer for the cell matrix;
defining the third undoped polysilicon layer to produce gate regions for the MOS transistors of the control circuitry using a second mask while removing the third undoped polysilicon layer from the active areas for the cell matrix;
performing a self-aligned etching step above the active areas for the cell matrix to define gates for the memory cells using a third mask protecting the active areas for the control circuitry; and
implanting dopants in junction areas to produce source/drain regions for the memory cells.

15. A process according to claim 14, further comprising doping the first polysilicon layer.

16. A process according to claim 14, wherein forming the plurality of active areas comprises forming N wells and P wells.

17. A process according to claim 14, wherein the second polysilicon layer is heavily doped.

18. A process according to claim 14, further comprising removing the at least one additional dielectric layer from the cell matrix using the second mask after removing the third undoped polysilicon layer.

19. A process according to claim 14, further comprising:
performing a first implantation in junction areas to produce source/drain regions for the MOS transistors in the control circuitry;
forming spacers on the gate regions for the MOS transistors in the control circuitry; and
performing a second implantation in the source/drain regions and in the gate regions to produce gates for the MOS transistors in the control circuitry.

20. A process according to claim 14, further comprising forming a salicide layer on the semiconductor substrate external the cell matrix.

21. A process according to claim 14, further comprising:
forming at least one pre-metal dielectric layer on the active areas for the cell matrix and the control circuitry;
forming contact openings through the at least one pre-metal dielectric layer and corresponding underlying layers associated therewith; and
forming metallization and final passivation layers.

22. A process according to claim 14, wherein the cell matrix is formed so that the memory device is at least one of an EPROM device and a flash EPROM device.

23. A process for manufacturing floating gate memory cells in a semiconductor substrate for a cell matrix having associated therewith control circuitry comprising both N-channel and P-channel MOS transistors, the process comprising:
forming a plurality of active areas in the semiconductor substrate for the cell matrix and the control circuitry;
forming a first dielectric layer and a first conducting layer on the active areas to produce floating gate regions for the memory cells;
forming a second dielectric layer on the first conducting layer;
forming a second conducting layer on the first conducting layer;
removing a stack structure defined by the second conducting layer, the second dielectric layer, the first conducting layer, and the first dielectric layer from the active areas for the control circuitry using a first mask;
forming at least one additional dielectric layer and a third conducting layer on the active areas for the control circuitry and on the second conducting layer for the cell matrix;
defining the third conducting layer to produce gate regions for the MOS transistors of the control circuitry using a second mask while removing the third conducting layer from the active areas for the cell matrix;

performing a self-aligned etching step above the active areas for the cell matrix to define gates for the memory cells using a third mask protecting the active areas for the control circuitry;

implanting dopants in junction areas to produce source/drain regions for the memory cells; and implanting dopants in junction areas to produce source/drain regions for the MOS transistors in the control circuitry.

24. A process according to claim 23, further comprising doping the first conducting layer.

25. A process according to claim 23, further comprising doping the second conducting layer to reduce a resistance thereof.

26. A process according to claim 23, wherein forming the plurality of active areas comprises forming N. wells and P wells.

27. A process according to claim 23, wherein the second conducting layer is heavily doped.

28. A process according to claim 23, wherein the third conducting layer is not doped.

29. A process according to claim 23, further comprising removing the at least one additional oxide layer from the cell matrix using the second mask after removing the third conducting layer.

30. A process according to claim 23, wherein implanting dopants in junction areas to produce source/drain regions for the MOS transistors in the control circuitry comprises:

performing a first implantation in junction areas in the control circuitry;

forming spacers on the gate regions for the MOS transistors in the control circuitry; and performing a second implantation in the source/drain regions and in the gate regions to produce gates for the MOS transistors in the control circuitry.

31. A process according to claim 23, further comprising forming a salicide layer on the semiconductor substrate external the cell matrix.

32. A process according to claim 23, further comprising:

forming at least one pre-metal dielectric layer on the active areas for the cell matrix and the control circuitry;

forming contact openings through the at least one pre-metal dielectric layer and corresponding underlying layers associated therewith; and forming metallization and final passivation layers.

33. A process according to claim 23, wherein the cell matrix is formed so that the memory device is at least one of an EPROM device and a flash EPROM device.

* * * * *